United States Patent [19]
Ayers

[11] Patent Number: 6,080,297
[45] Date of Patent: *Jun. 27, 2000

[54] METHOD AND APPARATUS FOR CONSTANT COMPOSITION DELIVERY OF HYDRIDE GASES FOR SEMICONDUCTOR PROCESSING

[75] Inventor: William M. Ayers, Princeton, N.J.

[73] Assignee: Electron Transfer Technologies, Inc., Edison, N.J.

[ * ] Notice: This patent is subject to a terminal disclaimer.

[21] Appl. No.: 09/077,704

[22] PCT Filed: Dec. 6, 1996

[86] PCT No.: PCT/US96/18836

§ 371 Date: Jun. 5, 1998

§ 102(e) Date: Jun. 5, 1998

[87] PCT Pub. No.: WO97/20965

PCT Pub. Date: Jun. 12, 1997

Related U.S. Application Data

[60] Provisional application No. 60/008,245, Dec. 6, 1995.

[51] Int. Cl.$^7$ .............................. C25B 1/00; C25D 17/00; C30B 28/14
[52] U.S. Cl. .......................... 205/464; 205/550; 204/258; 117/99; 438/935
[58] Field of Search ..................................... 205/464, 550; 204/258, 252, 263; 117/99; 438/935

[56] References Cited

U.S. PATENT DOCUMENTS

| | | | |
|---|---|---|---|
| 3,109,785 | 11/1963 | Gordon | 204/90 |
| 3,109,795 | 11/1963 | Gordon | 204/101 |
| 3,262,871 | 7/1966 | Miller et al. | 204/266 |
| 3,337,443 | 8/1967 | Raetzsch et al. | 204/256 |
| 3,404,076 | 10/1968 | Haycock et al. | 204/101 |
| 4,178,224 | 12/1979 | Porter | 204/237 |
| 5,158,656 | 10/1992 | Ayers | 204/101 |
| 5,425,857 | 6/1995 | Bouard et al. | 204/101 |
| 5,573,334 | 11/1996 | Anderson | 366/162.4 |
| 5,925,232 | 7/1999 | Ayers | 205/464 |

OTHER PUBLICATIONS

W.V. Lloyd, "The Overpotential Of Arsenic And The Yields Of Arsine At An Arsenic Cathode In Acid Solutions," *Transactions of the Faraday Society*, vol. XXVI, pp. 15–18 (1930). No Month Available.

H.W. Slazberg and B. Goldschmidt, "Arsine Evolution And Water Reduction At An Arsenic Cathode," *J. Electrom. Soc.*, vol. 107, No. 4, pp. 348–353 (1960). No Month Available.

M. Spasic, D. Vucurovic,. R. Vracar and I. Ilic, "A Contribution On The Hydrometallurgical Production Of Mercury From Mercury Ores Of The Suplja Stena Area—Avala," *Glasnik Hemijskog Drustva*, vol. 28, Nos. 3–4, pp. 212–222 (1963. No Month Available.

*Primary Examiner*—Arun S. Phasge
*Assistant Examiner*—Edna Wong
*Attorney, Agent, or Firm*—Woodard, Emhardt, Naughton, Moriarty & McNett, Patent and Trademark Attorneys

[57] ABSTRACT

The present invention provides an electrochemical system and process for the production of very high purity hydride gases and the feed product streams including these hydride gases at constant composition over extended periods of time. The processes and apparatuses of the invention can employ a lined pressure vessel (1) within which resides an electrochemical cell including cathode (2) and anode (3) material. The hydride gas produced within the vessel exits through port (4) to a manifold which contains automatic valve (8) to allow exit of the hydride gas. The hydride gas passes through one or more filters (7). The gas finally exits the manifold through a pressure regulator (6) to the point where it is utilized in semiconductor fabrication. A source of gas (11) for mixing with the hydride gas is also included.

42 Claims, 1 Drawing Sheet

METHOD AND APPARATUS FOR CONSTANT COMPOSITION DELIVERY OF HYDRIDE GASES FOR SEMICONDUCTOR PROCESSING

REFERENCE TO RELATED APPLICATION

This is a National Stage application of PCT/US96/18836 filed Dec. 6, 1996 which claims the benefit of U.S. Provisional Application No. 60/008,245, filed Dec. 6, 1995, which is hereby incorporated by reference in its entirety.

BACKGROUND OF THE INVENTION

The present invention relates generally to electrochemical synthesis methods for producing high purity hydride gases for semiconductor fabrication and doping. The invention relates more particularly to the electrochemical synthesis and production of Group IV and V volatile hydrides such as phosphine, arsine, stibine, and germane.

As further background, high purity gases are required for semiconductor fabrication and doping. Often these gases are extremely toxic and hazardous. Hence, centralized production, transportation and storage of these materials presents a hazard to those working with them. On-site electrochemical synthesis of these gases provides an alternative means to provide such gases to the semiconductor industry in a safe manner. The process described below allows the gas to be generated as needed thereby minimizing the amount of gas present prior to use in a semiconductor fabrication reactor. This provides a substantial advantage over the use of compressed gas in cylinders. Commercial compressed gas cylinders store gas at several thousand pounds per square inch pressure and contain one to ten pounds of gas. Hence, gas cylinders present a major chemical release hazard. On-site electrochemical generation of the gas eliminates this hazard.

The following references disclose processes for producing these gases by chemical methods. Cotton and Wilkinson, "Advanced Inorganic Chemistry", *Wiley Interscience*, Fourth Ed. (1980) and Brauer, "Preparative Inorganic Chemistry", *Academic Press* (1963) teach that the Group IV and V hydrides can be produced by chemical reduction of electropositive compounds of the desired product gas element with acids or the reduction of the halides with $LiAlH_4$ or $NaBH_4$. For example:

$$Na_3P + 3H_2O \rightarrow PH_3 + NaOH$$

$$Mg_3Sb_2 + 6HCl \rightarrow 2SbH_3 + 3MgCl_2$$

$$Na_3As + 3NH_4Br \rightarrow AsH_3 + 3NaBr + 3NH_3$$

$$Mg_2Ge + 4NH_4Br \rightarrow GeH_4 + 2MgBr_2 + 4NH_3$$

$$GeCl_4 + LiAlH_4 \rightarrow GeH_4 + LiCl + AlCl_3$$

These gases can also be prepared by the electrochemical reductions:

$$Sb + 3H_2O + 3e \rightarrow SbH_3 + 3OH^-$$

$$As + 3H_2O + 3e \rightarrow AsH_3 + 3OH^-$$

$$Ge + 3H_2O + 3e \rightarrow GeH_4 + 3OH^-$$

$$P + 3H_2O + 3e \rightarrow PH_3 + 3OH^-$$

In addition, dissolved ionic precursors can be used such as:

$$H_2PO_2^- + 5H^+ + 4e \rightarrow PH_3 + 2H_2O$$

Salzberg, *J. Electrochem. Soc.*, 101:528 (1964) discloses the electrochemical formation of stibine at an antimony cathode. Lloyd, *Trans. Faraday Soc.*, 26:15 (1930) and Salzberg, *J. Electrochem. Soc.*, 107:348 (1960) disclose the preparation of high purity arsine at an arsenic cathode. Spasic, *Glas. Hem. Drus. Beograd.*, 28:205 (1963) discloses the electrochemical production of germanium hydride.

E. W. Haycock and P. R. Rhodes (U.S. Pat. No. 3,404,076) disclose a method for the electrolytic preparation of volatile hydrides. Gordon and Miller (U.S. Pat. Nos. 3,109,785 and 3,109,795), Miller and Steingart (U.S. Pat. No. 3,262,871) and Miller (U.S. Pat. No. 3,337,443) disclose electrolytic methods for the production of phosphine.

Porter, in U.S. Pat. No. 4,178,224, discloses an electrochemical method for the synthesis of arsine gas. His method utilizes a dissolved arsenic salt with an oxygen evolving anode. With this method, the arsine concentration was limited to less than 25%. Another limitation of Porter's method was the need to balance pressures and liquid levels in the divided anode and cathode sections of the electrochemical cell. This requires an inert gas supply to the cell.

W. M. Ayers, in U.S. Pat. No. 5,158,656, describes an electrochemical apparatus and method for supplying volatile hydrides at the proper pressure for introduction into a chemical vapor deposition reactor.

While efforts have continued to provide effective means for producing and delivering hydride gases, needs still exist related to the quality and consistency of delivered product streams including hydride gases. The present invention addresses these needs.

SUMMARY OF THE INVENTION

Briefly describing one preferred embodiment of the invention, provided is a method for consistent composition delivery of a product gas stream including a hydride gas. The method includes the steps of:

electrochemically generating a first gas feed stream including a hydride gas, said first gas feed stream having a varying level of hydride gas over time;

mixing said first gas feed stream with a second gas including a diluent gas, to form a product gas stream including the diluent gas and the hydride gas;

monitoring the level of diluent gas and hydride gas in said product gas stream; and executing control software for maintaining a predetermined ratio of said hydride gas to said diluent gas in said product stream over time, the execution of said control software causing variation in the amount of said second gas provided to said mixing step in response to said monitored level, so as to form said product gas having said predetermined ratio of gases.

Another preferred embodiment of the invention provides a system for consistent composition delivery of a product gas stream including a hydride gas. The system includes:

an electrolytic cell for generating a first gas feed including a hydride gas;

a controllable source for delivering a second gas feed including a diluent gas so as to mix said second gas feed and said first gas feed to produce a product gas stream;

means for obtaining a first signal proportional to the ratio of hydride gas and diluting gas in said product gas stream;

digital signal processing means for processing the first signal and producing a second signal; and wherein said controllable source for delivering a second gas feed varies the level of said second gas feed in response to said second signal, so as to maintain a substantially constant ratio of the hydride gas and the diluent gas in the product stream over time.

Another embodiment of the invention provides an electrochemical reactor system for generation of high purity gas. The system includes:

a vessel (e.g. steel vessel) capable of sustaining pressures up to 100 pounds per square inch;

an electrochemical cell with anode and cathode electrodes within the vessel and effective for producing a generated gas;

a manifold for delivery of the gas produced by the cell;

a source of diluent gas mixable with said generated gas to produce a product gas;

monitoring means for periodically monitoring generated gas and diluent gas concentrations in said product gas; and an electronic control system operably associated with said monitoring means and operable to control the amount of diluent gas delivered to said product gas so as to control the ratio of said generated gas and diluent gas in said product gas.

Still another embodiment of the invention includes an apparatus for delivering product gas containing a controlled level of hydride gas. The apparatus comprises:

an electrolytic cell for generating a hydride gas feed;

a source of diluent gas feed fluidly coupled to said hydride gas feed to form a product gas feed;

electronic control means for automatically controlling the ratio of said hydride gas feed and diluent gas feed in said product gas feed so as to maintain a predetermined ratio of the hydride gas and the diluent gas in the product gas.

Preferred embodiments of the invention provide improved electrochemical systems and processes for the production of very high purity volatile hydrides such as arsine, stibine, germane, and phosphine. More preferred systems and processes employ a substantially pure cathode host material in a suitable form such as a rod, packed bed or slurry, (ii) a pressurized reactor, (iii) a non-oxygen evolving anode, (iv) water vapor removal system, (v) a gas concentration analyzer (sensor) on the manifold, (vi) a mass flow controller, and (vii) an electronic control system to maintain uniformity of production, including maintaining the product hydride gas concentration at a predetermined value regardless of fluctuations in the output concentrations from the electrolytic hydride generation cell.

Additional objects, features, advantages and embodiments of the invention will be apparent from the following description and claims.

DESCRIPTION OF THE FIGURE

The invention is particularly illustrated in the accompanying figure.

DETAILED DESCRIPTION OF THE INVENTION

Figure 1:
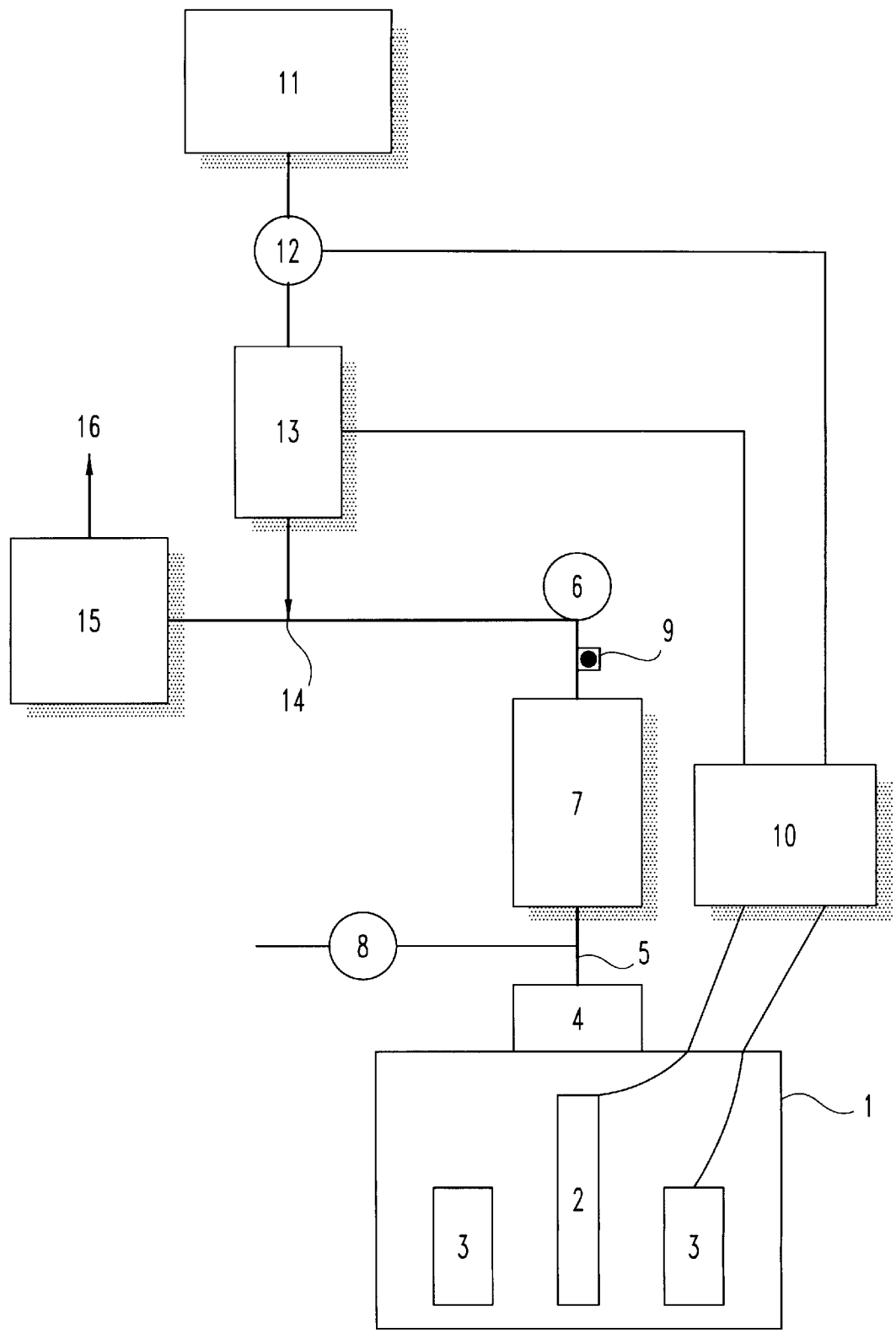
FIG. 1 shows an illustrative apparatus for carrying out processes of the invention.

The present invention provides an electrochemical system and process for the production of very high purity hydride gases and the feed of gas product streams including these hydride gases at constant composition over extended periods of time.

Processes and apparatuses of the invention can employ a lined pressure vessel 1 within which resides the electrochemical cell including cathode 2 and anode 3 material. Other support structures may also be included in the cell as known in the art. The hydride gas produced within the vessel exits through a port 4 to a manifold which contains automatic valve 8 to allow exit of the hydride gas as well as the addition of a purge gas and means to evacuate the vessel. The hydride gas passes through one or more filters 7, such as molecular sieves, which remove water or solvent vapor and other impurities from the volatile hydride gas. The gas finally exits the manifold through a pressure regulator 6 to the point where it is utilized in semiconductor fabrication.

A microprocessor 10 controls the electrical current to the cell. The rate at which the current is supplied to the cell is dependent on the hydride gas generated. The hydride gas generation system can be operated in a feed-back control mode to provide constant pressure delivery of the gas. In this mode, a pressure sensor 9 is mounted in line before the delivery regulator. The microprocessor computer monitors the pressure signal and compares it to a desired set-point pressure. The microprocessor then increases or decreases the current to the electrochemical cell to meet the set-point.

The microprocessor also controls the sequencing of the manifold valves. This allows easy operation of the complex combination of switching operations. The microprocessor controller is remotely linked to a terminal device in a near-by or remote location. The microprocessor and power supply are preferably located near the vessel containing the electrochemical cell.

The apparatus of FIG. 1 also includes a source of gas 11, such as hydrogen gas, for mixing with the hydride gas generated by the electrolytic cell. The gas from source 11 passes through valve 12 which is also controlled by microprocessor 10. This gas then passes through a microprocessor controlled mass flow controller 13 and mixes with the electrolytic cell-generated gas, passes through a mixing device 14 such as a mixing tee, and then through a gas concentration monitor 15. Gas monitor 15 continuosly analyzes the product gas and monitors relative concentrations of gases present, and provides a signal for processing by microprocessor 10 and ultimate modulation of the feed of diluent gas into the product gas stream 16. It will be readily understood by those skilled in the art that a variety of components and arrangements can be provided for purposes of establishing an electronic control system which in response to sensed gas levels modulates or controls the levels of gas in the mixed product stream. These are contemplated as being within the scope of the present invention.

Suitable cathode materials for use in the invention include, for instance, those which contain Sb, As, Se (to make hydrogen selenide), Zn, Pb, Cd and alloys thereof. Suitable anode materials include, for example, those containing molybdenum, vanadium, cadmium, lead, nickel hydroxide, chromium, antimony, and generally hydrogen oxidation anodes. A redox anode material may also be used, for example inluding $MnO_2/MnO_3$, $Fe(OH)_2/Fe_3O_4$, $Ag_2O/Ag_2O_2$, or $Co(OH)_3/Co(OH)_2$. In addition, soluble, oxidizible ionic species with an oxidation potential less than 0.4 volts versus an Hg/HgO reference electrode can be used as anodes in embodiments of the present invention as disclosed herein.

Illustrative electrolytes which can be used in the invention include aqueous electrolytes such as aqueous alkali or alkaline earth metal hydroxides, e.g. NaOH, KOH, LiOH and combinations thereof. Water, deuterated water ($D_2O$) and mixtures thereof may be used in the electrolytes.

As one illustrative example of the invention, in the course of operating an electrolytic cell of the packed bed configuration, a typical output gas composition produced at the cathode is 90% arsine and 10% hydrogen. It has been observed that the concentration of the by-product hydrogen gas increases as the arsenic electrode material is consumed. This increase in hydrogen and therefore decrease in arsine concentration is undesirable in compound semiconductor manufacturing. Changes in the arsine concentration during semiconductor fabrication in the chemical deposition reactor can alter the quality of the semiconductor material.

Typically, an arsine electrolytic cell will produce 90% arsine and 10% by-product hydrogen when the packed bed electrode contains a full charge of arsenic. As the arsenic electrode is consumed, the arsine concentration decreases in a nearly linear fashion to 60% arsine and 40% hydrogen. Therefore, to maintain a constant arsine/hydrogen concentration ratio during the lifetime of the arsenic electrode, more diluting hydrogen must be added initially than at the end of the consumption of the electrode. For example, to maintain a constant 60% arsine concentration during consumption of the arsenic electrode, initially 40% hydrogen would be added to the product gas (i.e. 30% diluting hydrogen plus the 10% hydrogen produced by the generator). At the end of the electrode life, no diluting hydrogen would need to be added to the product gas.

Hence, in a feature of the present invention, a microprocessor based feed-back algorithm applied in an apparatus such as that illustrated in FIG. 1 monitors the product gas concentration (arsine and hydrogen concentration) (e.g. in monitor 15) and increases or decreases the addition of hydrogen from hydrogen source 11 to maintain a constant arsine/hydrogen concentration ratio during the course of the semiconductor fabrication run.

An additional benefit of this feed-back gas composition device and algorithm in the ability to selectively fix the arsine/hydrogen product gas ratio. For example, rather than purchasing pre-mixed gas cylinders containing a specific arsine and hydrogen concentration with the gas generator, the operator can choose any arsine/hydrogen gas composition via the software controlling the real-time blending system. This provides the convenience of being able to "dial-in" a desired hydride concentration from the generator rather than purchasing many different gas cylinders with different pre-mixed gas concentrations.

For processes and systems of the invention, the host cathode can be configured as a solid cathode of multiple sections. One particular configuration for processes and systems of the invention utilizes a packed bed electrochemical generator. The host cathode material is in the form of particles, shot, or chunks. An insulated central cathode lead brings electrical current to the base of the packed bed. The packed bed material is confined in a cage of perforated or screen polymer material. This facilitates rapid exchange of electrolyte into the bed and allows evolved hydride gas to exit from the cathode material.

A concentric anode surrounds the cathode bed. The anode consists of a material which oxidizes without the evolution of oxygen or other gases. For example, an anode of cadmium oxidizes to form cadmium hydroxide without the evolution of oxygen. Similarly the oxidation of molybdenum to molybdate or vanadium to vanadate does not involve oxygen. These anode materials must be supplied in sufficient quantity so that the utilization of the hydride forming material is complete prior to the full oxidation of the anode material. This is similar to the anode requirements in a nickel-cadmium battery to prevent overcharging and oxygen evolution.

An alternative anode consists of a dissolved chemical species which can be oxidized without the evolution of oxygen or other contaminant gases. For example, soluble redox couples such as Fe(EDTA)-/-4 which can be oxidized on an inert high oxygen overpotential anode, e.g. smooth platinum or gold, without evolving oxygen.

A third anode type is the hydrogen oxygen oxidation anode. In this case an external source of hydrogen would be fed to the anode to be oxidized to protons. Some of the hydrogen requirement for the anode could be supplied from the cathode reaction.

A second configuration of the electrochemical cell is that of a slurry reactor. In this type of electrochemical reactor, the raw material for the cathode reaction consists of a finely divided slurry of material in an aqueous electrolyte. A central cathode lead provides the negative voltage lead to the slurry. Surrounding the slurry is a microporous separator, or ion exchange membrane supported on a fine plastic screen. Concentric and outside of this screen is a non-oxygen evolving anode. Systems of the invention may also have an electrolytic cell that comprises a host cathode configured as a fluidized bed cathode.

For poorly conductive cathode materials such as phosphorous, red or black phosphorous powder as a slurry can be placed in contact with a high hydrogen overpotential lead or cadimium cathode. Reduction of the phosphorous particles at the cathode results in the production of phosphine and hydrogen.

Methods of the present invention are preferably conducted so as to produce highly pure hydride gases as generally known in the industry. The hydride gas may contain no more than 100 parts per million of oxygen, water vapor or solvent vapor. More preferably, the product hydride gas will contain no more than 10 parts per million of oxygen, water vapor or solvent vapor, more preferably no more than 5 parts per million of oxygen, water vapor or solvent vapor.

In order to promote a further understanding of the principles of the invention and its features and advantages, the following examples are provided. It will be understood, however, that these examples are illustrative, and not limiting, of the invention.

EXAMPLE 1

Arsenic chips of 99.9999% purity and approximately 4 millimeters in size are placed in a packed bed electrochemical cell. A lead rod, 10 millimeters in diameter, feeds current to a lead plate on which the arsenic shot is supported. Four cadmium or molybdenum anodes surround the cathode bed. The electrolyte is 1 N KOH. All electrode and electrolyte components are in a Teflon lined, stainless steel vessel. A constant current of 50 amperes is applied between the cathode and anode. The yield of arsine is approximately 90% with the balance consisting of hydrogen. The arsine produced this way is of unexpectedly extremely high purity with less than 2 parts per billion of other hydride impurities. Two water vapor removal cylinders filled with Linde 3A molecular sieve decrease the water vapor content of the evolved arsine to at least 10 parts per million.

EXAMPLE 2

An antimony metal disk, 1 centimeter in diameter, is immersed into an electrolyte of 1 N $NH_4OH$. The antimony is held at a constant potential of −4 V versus a silver/silver chloride reference electrode. Stibine, antimony hydride, is evolved along with hydrogen. The stibine yield is at least 1%. The addition of a minute concentration of lead sulfate (e.g. $10^{-5}$ Molar) increase the yield to at least 4%. Decreasing the temperature to 5° C. also increases the yield.

EXAMPLE 3

The above antimony disk of Example 2 is immersed in an electrolyte of 1 N $Na_2SO_4$ in $H_2O$. The antimony is held at a constant potential of −5 V vs Ag/AgCl. The current efficiency for stibine evolution in 0.23%. Substituting $D_2O$ for normal water in the $Na_2SO_4$ electrolyte and operating under the same potential control conditions increases the current efficiency to more than 1%.

EXAMPLE 4

A solid piece of germanium, approximately 10 grams in weight, is fabricated into a cathode by the attachment of a copper wire and an indium contact. The contact and wire are sealed in epoxy and glass and the germanium is immersed into a 1 N NaOH electrolyte. A BAS potentiostat holds the cathode at a constant potential of −2 V vs. a calomel reference electrode. The counter electrode is a large piece of cadmium. Both hydrogen and germaine evolve off the germanium cathode at room temperature. The current efficiency of germanium hydride is approximately 30% with hydrogen forming the balance of the evolved gas.

EXAMPLE 5

Many applications for semiconductor growth require fine control of the hydride gas concentration. For example in the fabrication of AlGaAs compounds, the concentration of arsine entering the CVR (CVD) reactor must be constant to within +/−1%. To avoid variations in the arsine/hydrogen ratio produced by the gas generator and to enhance the percentage of arsine entering the CVR reactor, a method is practiced to maintain constant composition. In this method, a feed back loop is used to control the mixing of the two gases and thereby maintain constant composition. Thus, the operation of a hydride gas generator such as that described in connection with FIG. 1, is through a computer control program and microprocessor 10. These initiate operation of the electrochemical cell and check the concentration of arsine produced. The arsine concentration is determined by the real-time gas concentration analyzer 15 mounted in the gas manifold. Suitable analyzers for this purpose are available commercially. For example, these include the EPISON analyzer manufactured by Thomas Swann Ltd., and the SONOSENSE analyzer, manufactured by Telosense Inc. In this example, the electrolytic arsine generation cell is initially producing 90% arsine and 10% hydrogen. The operator decides that 30% arsine and 70% hydrogen is the appropriate gas mixture for this particular semiconductor fabrication run. Therefore, the operator enters this gas composition into the computer program by specifying 30% arsine. The microprocessor controller 10 increases the flow of the diluting gas (hydrogen) through the mass flow controller 13 (MFC) into the mixing device 14. The blended gas mixture then passes through the gas analyzer and flows out to the chemical vapor deposition process. A feed-back loop in the microprocessor controller continues to periodically check the gas analyzer arsine/hydrogen concentration and increases or decreases the flow of hydrogen through the MFC to the mixing tee to maintain the desired product gas concentration. In this manner, variations in the arsine concentration produced by the electrolytic generation cell are corrected to maintain the desired constant mixed product gas composition.

While the invention has been illustrated and described in detail in the drawing and foregoing description, the same is to be considered as illustrative and not restrictive in character, it being understood that only the preferred embodiment has been shown and described and that all changes and modifications that come within the spirit of the invention are desired to be protected.

All publications cited herein are indicative of the level of skill in the art and are hereby incorporated by reference in their entirety as if each had been individually incorporated by reference and fully set forth.

What is claimed is:

1. A method for consistent composition delivery of a product gas stream including a hydride gas, comprising:
    electrochemically generating a first gas feed stream including a hydride gas, said first gas feed stream having a varying level of the hydride gas over time;
    mixing said first gas feed stream with a second gas including a diluent gas, to form a product gas stream including a level of the diluent gas and a level of the hydride gas;
    monitoring the level of the diluent gas and the hydride gas in said product gas stream; and
    executing control software for maintaining a predetermined ratio of said hydride gas to said diluent gas in said product stream over time, the execution of said control software causing variation in an amount of said second gas provided to said mixing step in response to said monitored level, so as to form said product gas having said predetermined ratio of gases.

2. The method of claim 1 wherein said electrochemical generating is with an electrolytic cell comprising a host cathode for generating a hydride gas.

3. The method of claim 2 wherein the host cathode is configured as a packed bed cathode.

4. The method of claim 2 wherein the host cathode is configured as a solid cathode of multiple sections.

5. The method of claim 2 wherein the host cathode is configured as a slurry bed cathode.

6. The method of claim 2 wherein the host cathode comprises antimony and the hydride gas is stibine.

7. The method of claim 2 wherein the host cathode comprises red or black phosphorous and the hydride gas is phosphine.

8. The method of claim 2 wherein the host cathode comprises germanium and the hydride gas is germane.

9. The method of claim 2 wherein the host cathode is arsenic and the hydride gas is arsine.

10. The method of claim 2 wherein the host cathode is selenium and the hydride gas is hydrogen selenide.

11. The method of claim 2 wherein the host cathode comprises a material selected from the group consisting of Sb, As, Se, Zn, Pb, Cd and alloys thereof.

12. The method of claim 1 wherein the hydride gas contains no more than 5 parts per million of oxygen, water vapor or solvent vapor.

13. The method of claim 2 wherein said electrochemical generating includes an anode reaction which is a non-oxygen evolving oxidation.

14. The method of claim 2 wherein an anode material is used which is selected from the group lead, cadmium and nickel hydroxide.

15. The method of claim 2 wherein an anode material is used which is a consumable anode selected from the group consisting of molybdenum, vanadium, chromium and antimony.

16. The method of claim 2 wherein an anode material is used which is a redox anode material selected from the group consisting of $MnO_2/MnO_3$, $Fe(OH)_2/Fe_3O_4$, $Ag_2O/Ag_2O_2$, and $Co(OH)_3/Co(OH)_2$.

17. The method of claim 2 wherein an anode is used which is a soluble, oxidizible ionic species with an oxidation potential less than 0.4 volts versus an Hg/HgO reference electrode.

18. The method of claim 2 wherein an anode is used which is an hydrogen oxidation anode.

19. The method of claim 1 wherein an electrolyte is used which is selected from the group of aqueous electrolytes consisting of aqueous NaOH, KOH, LiOH and combinations thereof.

20. The method of claim 1 wherein an electrolyte solvent is used which is selected from the group consisting of water, deuterated water and mixtures thereof.

21. A system for consistent composition delivery of a product gas stream including a hydride gas, the system comprising:
an electrolytic cell for generating a first gas feed including a hydride gas;
a controllable source for delivering a second gas feed including a diluent gas so as to mix said second gas feed and said first gas feed to produce a product gas stream;
means for obtaining a first signal proportional to a ratio of hydride gas and diluting gas in said product gas stream;
digital signal processing means for processing the first signal and producing a second signal; and
wherein said controllable source for delivering a second gas feed varies the level of said second gas feed in response to said second signal, so as to maintain a substantially constant ratio of the hydride gas and the diluent gas in the product stream over time.

22. The system of claim 21 wherein said electrolytic cell comprises a host cathode material configured as a packed bed cathode.

23. The system of claim 21 wherein said electrolytic cell comprises a host cathode material configured as a solid cathode of multiple sections.

24. The system of claim 21 wherein said electrolytic cell comprises a host cathode configured as a slurry or fluidized bed cathode.

25. The system of claim 21 wherein the electrolytic cell includes a host cathode comprising antimony and the hydride gas is stibine.

26. The system of claim 21 wherein the electrolytic cell includes a host cathode which comprises red or black phosphorous and the hydride gas is phosphine.

27. The system of claim 21 wherein the electrolytic cell includes a host cathode which comprises germanium and the hydride gas is germane.

28. The system of claim 21 wherein the electrolytic cell includes a host cathode which includes arsenic and the hydride gas is arsine.

29. The system of claim 21 wherein the electrolytic cell includes a host cathode which includes selenium and the hydride gas is hydrogen selenide.

30. The system of claim 21 wherein the electrolytic cell includes a host cathode which comprises a material selected from the group consisting of Sb, As, Se, Zn, Pb, Cd and alloys thereof.

31. The system of claim 21 wherein the hydride gas contains no more than 100 parts per million of oxygen, water vapor, or solvent vapor.

32. The system of claim 21 wherein said electrolytic cell includes an anode reaction which is a non-oxygen evolving oxidation.

33. The system of claim 21 wherein the electrolytic cell includes an anode material which is selected from the group lead, cadmium and nickel hydroxide.

34. The system of claim 21 wherein the electrolytic cell includes a consumable anode comprising a material selected from the group consisting of molybdenum, vanadium, chromium, and antimony.

35. The system of claim 21 wherein the electrolytic cell includes an anode material which is a redox anode material selected from the group consisting of $MnO_2/MnO_3$, $Fe(OH)_2/Fe_3O_4$, $Ag_2O/Ag_2O_2$, and $Co(OH)_3/CO(OH)_2$.

36. The system of claim 21 wherein the electrolytic cell includes an anode which is a soluble, oxidizible ionic species with an oxidation potential less than 0.4 volts versus an Hg/HgO reference electrode.

37. The system of claim 21 wherein the electrolytic cell includes an anode which is an hydrogen oxidation anode.

38. The system of claim 21 wherein the electrolytic cell includes an electrolyte selected from the group consisting of aqueous electrolytes of NaOH, KOH, LiOH and combinations thereof.

39. The system of claim 21 wherein the electrolytic cell includes an electrolyte solvent selected from the group consisting of water, deuterated water ($D_2O$) and mixtures thereof.

40. An apparatus for delivering product gas containing a controlled level of hydride gas, comprising:
an electrolytic cell for generating a hydride gas feed in which the concentration of hydride gas varies over time;
a source of diluent gas feed fluidly coupled to said hydride gas feed to form a product gas feed; and
electronic control means operable to automatically control the ratio of said hydride gas feed and diluent gas feed in said product gas feed so as to maintain a predetermined ratio of the hydride gas and the diluent gas in the product gas.

41. An apparatus for delivering product gas containing a controlled level of hydride gas, comprising:
electrochemical means for electrochemically generating a hydride gas feed for inclusion in a product gas feed, said electrochemical means generating hydride gas at a rate which varies over time;
means for delivering a diluent gas to the product gas feed; and
controlled means operable to modulate an amount of diluent gas delivered to the product gas feed as necessary to maintain a substantially constant, predetermined ratio of hydride gas and diluent gas in the product gas over time.

42. A method for delivering product gas containing a controlled level of hydride gas, comprising:
generating, in an electrolytic cell, a hydride gas feed in which the concentration of hydride gas varies over time;
feeding a diluent gas feed to said hydride gas feed to form a product gas feed; and
executing electronic control means which automatically controls the ratio of said hydride gas feed and diluent gas feed in said product gas feed so as to maintain a predetermined ratio of the hydride gas and the diluent gas in the product gas feed.

* * * * *